United States Patent
Katayama

(10) Patent No.: US 8,054,053 B2
(45) Date of Patent: Nov. 8, 2011

(54) AUDIO APPARATUS, SWITCHING POWER SUPPLY, AND SWITCHING CONTROL METHOD

(75) Inventor: Masahiko Katayama, Neyagawa (JP)

(73) Assignee: Onkyo Corporation, Neyagawa-shi (JP)

( * ) Notice: Subject to any disclaimer, the term of this patent is extended or adjusted under 35 U.S.C. 154(b) by 641 days.

(21) Appl. No.: 12/251,566

(22) Filed: Oct. 15, 2008

(65) Prior Publication Data

US 2009/0213624 A1   Aug. 27, 2009

(30) Foreign Application Priority Data

Feb. 27, 2008   (JP) ................. 2008-045429

(51) Int. Cl.
G05F 1/563   (2006.01)
G05F 1/59   (2006.01)

(52) U.S. Cl. .......... 323/266; 323/271; 323/204

(58) Field of Classification Search ........... 363/15–16, 363/22–26, 97; 323/224, 282, 284, 266
See application file for complete search history.

(56) References Cited

U.S. PATENT DOCUMENTS

| | | | | |
|---|---|---|---|---|
| 5,590,033 A | * | 12/1996 | Kawano | 363/25 |
| 6,831,508 B2 | * | 12/2004 | Shima | 330/10 |
| 2003/0169103 A1 | | 9/2003 | Shima | |
| 2009/0225990 A1 | * | 9/2009 | Miyagi | 381/3 |

FOREIGN PATENT DOCUMENTS

| | | |
|---|---|---|
| JP | 57-115005 | 7/1982 |
| JP | 4-159803 | 6/1992 |
| JP | 2001-298330 | 10/2001 |
| JP | 2004-297367 | 10/2004 |
| JP | 2005-136717 | 5/2005 |
| JP | 2006-60580 | 3/2006 |
| WO | 2002/67416 | 8/2002 |

* cited by examiner

Primary Examiner — Gary L Laxton
Assistant Examiner — Henry Lee, III
(74) Attorney, Agent, or Firm — Renner, Otto, Boisselle & Sklar, LLP

(57) ABSTRACT

When power is turned on and in a state in which a power supply voltage is not supplied from the switching power supply to the second clock generating section, the first clock generating section generates a first clock signal with a frequency that is preset in the first clock generating section, without using a third clock signal from the frequency dividing section, to cause the first switching section to operate. By the first switching section operating, a power supply voltage is supplied from the switching power supply to the second clock generating section. After the second clock generating section has started to operate, a third clock signal (a clock signal obtained by dividing the frequency of a second clock signal generated by the second clock generating section) is supplied from the frequency dividing section to the first clock generating section. The first clock generating section generates a first clock signal with a frequency that is synchronized with the frequency of the third clock signal, to cause the first switching section to operate.

3 Claims, 8 Drawing Sheets

AUDIO APPARATUS, SWITCHING POWER SUPPLY, AND SWITCHING CONTROL METHOD

BACKGROUND OF THE INVENTION

1. Field of the Invention

The present invention relates to an audio apparatus that includes a switching amplifier and a switching power supply and controls the frequency of a clock signal that drives the switching power supply.

2. Description of the Related Art

Currently, an audio apparatus including a switching amplifier and a switching power supply is available. When combining a switching amplifier and a switching power supply, since clock signals that drive the two have different frequencies (also called carrier frequencies), interference (beat) occurs between the frequencies and falls down in an audible band, causing a big problem.

To suppress this, generation of clock signals of the switching amplifier and the switching power supply from the same source is considered. However, in the switching amplifier, in view of an influence on the audible band and an improvement in performance, the frequency of a clock signal is often set to a relatively high frequency (several hundred kHz or higher); on the other hand, in the switching power supply, in order to prevent an increase in switching loss, the frequency of a clock signal is set to a relatively low frequency. Thus, it is not realistic to set the same frequency for them.

To solve this problem, there is proposed a technique for suppressing occurrence of a beat by dividing the frequency of a clock signal that drives a switching amplifier at an arbitrary frequency division ratio and using a resultant frequency as the frequency of a clock signal that drives a switching power supply. With this technique, however, when power to an audio apparatus is turned on and in a state in which a power supply voltage from the switching power supply is not supplied to a clock generation circuit that generates a clock signal of the switching amplifier, a clock signal used to operate the switching amplifier cannot be generated. Thus, it is not also possible to generate a clock signal of the switching power supply by frequency-dividing a clock signal of the switching amplifier. Hence, there is a need to separately provide another power supply circuit (other than the switching power supply) for supplying, when power is turned on, a power supply voltage to a clock generation circuit for generating a clock signal of the switching amplifier, and cause the clock generation circuit to operate by a power supply voltage from another power supply circuit to generate a clock signal of the switching amplifier.

SUMMARY OF THE INVENTION

An object of the present invention is therefore to provide an audio apparatus that generates a clock signal of a switching power supply by dividing the frequency of a clock signal of a switching amplifier and is capable of causing the switching power supply to start to operate without separately providing another power supply circuit that supplies, when power is turned on, a power supply voltage to a clock generation circuit that generates a clock signal of the switching amplifier.

An audio apparatus as a preferred embodiment of the present invention comprises a switching power supply, a switching amplifier, and frequency dividing section, wherein the switching power supply includes: first switching section for outputting a power supply voltage to the switching amplifier by performing a switching operation; and first clock generating section for generating a first clock signal that causes the first switching section to perform a switching operation, the switching amplifier includes: pulse modulating section for generating a pulse modulated signal according to an input signal; second switching section that performs a switching operation by the pulse modulated signal; and second clock generating section caused to operate by the power supply voltage supplied from the switching power supply, to generate a second clock signal that drives the pulse modulating section, the frequency dividing section divides a frequency of the second clock signal supplied from the second clock generating section, to generate a third clock signal, in a state in which the third clock signal is not supplied from the frequency dividing section to the first clock generating section because a power supply voltage is not supplied from the switching power supply to the second clock generating section, the first clock generating section generates the first clock signal with a frequency that is preset in the first clock generating section, and in a state in which a power supply voltage is supplied from the switching power supply to the second clock generating section and thus the third clock signal is supplied from the frequency dividing section to the first clock generating section, the first clock generating section generates the first clock signal with a frequency that is synchronized with a frequency of the third clock signal.

When power is turned on and in a state in which a power supply voltage is not supplied from the switching power supply to the second clock generating section, the first clock generating section generates a first clock signal with a frequency that is preset in the first clock generating section, without using a third clock signal from the frequency dividing section, to cause the first switching section to operate. By the first switching section operating, a power supply voltage is supplied from the switching power supply to the second clock generating section. Accordingly, when power is turned on, too, the second clock generating section can be caused to start to operate by a power supply voltage from the switching power supply and thus there is no need to separately provide another power supply circuit for causing the second clock generating section to operate when power is turned on.

After the second clock generating section has started to operate, a third clock signal (a clock signal obtained by dividing the frequency of a second clock signal generated by the second clock generating section) is supplied from the frequency dividing section to the first clock generating section. The first clock generating section generates a first clock signal with a frequency that is synchronized with the frequency of the third clock signal, to cause the first switching section to operate. As used herein, the frequency that is synchronized with the frequency of the third clock signal refers to, for example, a frequency that is the same as the frequency of the third clock signal or a frequency obtained by further dividing the frequency of the third clock signal (e.g., by reducing the frequency to half). Accordingly, occurrence of a beat can be prevented by the first clock signal and the second clock signal.

BRIEF DESCRIPTION OF THE DRAWINGS

FIG. 4A is a diagram showing a simulation result showing a waveform at a terminal 104b (voltage at a capacitor C3) when power is turned on;

FIG. 4B is a diagram showing simulation results showing waveforms of clock signals CLK1 and CLK2 when power is turned on;

DETAILED DESCRIPTION OF THE PREFERRED EMBODIMENTS

Figure 1:
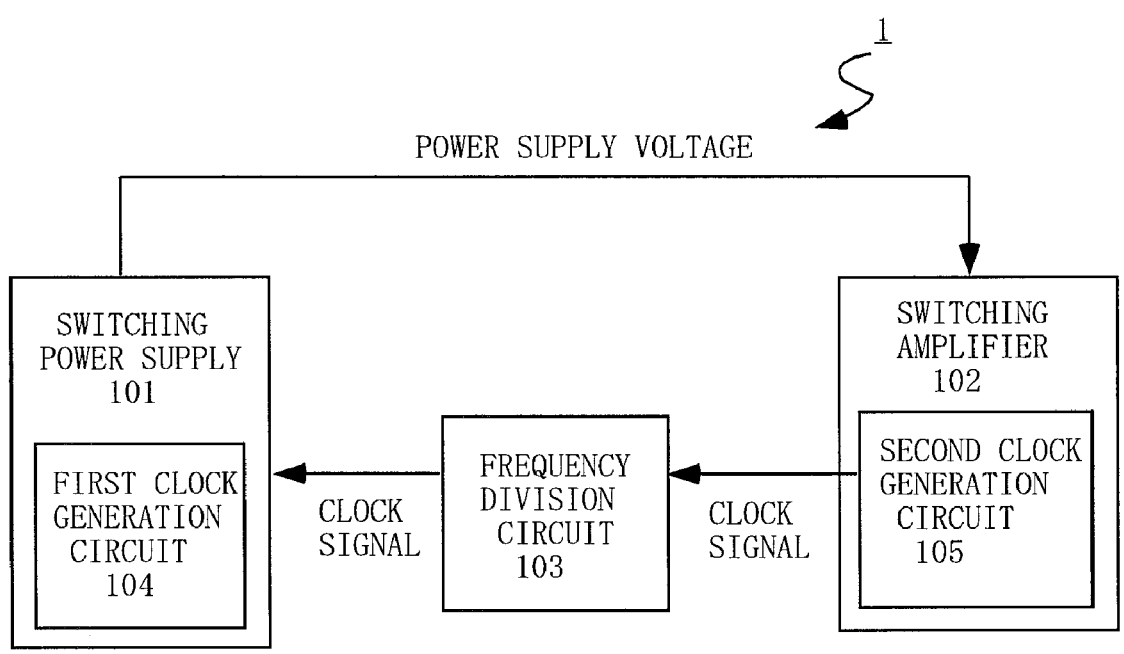
FIG. 1 is a schematic block diagram showing a configuration of an audio apparatus according to a preferred embodiment of the present invention.
Figure 2:
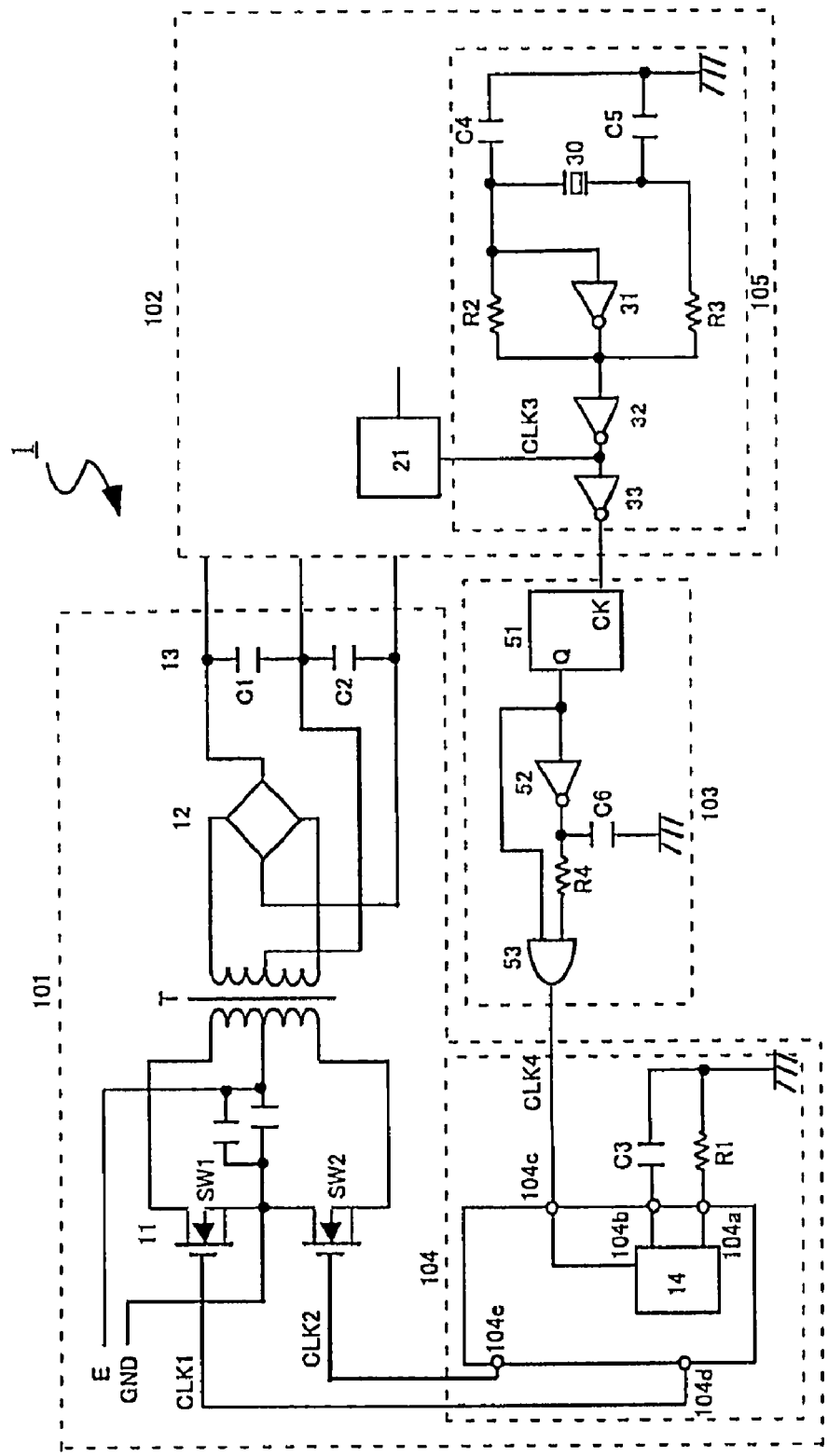
FIG. 2 is a detailed circuit diagram showing the configuration of the audio apparatus according to the preferred embodiment of the present invention.

Although a preferred embodiment of the present invention will be described in detail below with reference to the drawings, the present invention is not limited thereto. FIG. 1 is a schematic block diagram showing an audio apparatus 1 including a switching power supply 101 and a switching amplifier 102, according to a preferred embodiment of the present invention. FIG. 2 is a circuit diagram showing a detailed configuration of the audio apparatus 1.

(Summary)

As shown in FIG. 1, the audio apparatus 1 includes the switching power supply (DC/DC converter) 101 that supplies a power supply voltage to the switching amplifier 102; the switching amplifier 102 that performs switching amplification on an input signal (audio signal) to be inputted from an external source and supplies the amplified signal to a speaker (not shown); and a frequency division circuit 103 that frequency-divides a clock signal that drives a pulse width modulation circuit of the switching amplifier 102 and supplies a resultant clock signal to the switching power supply 101.

In the audio apparatus 1, when power is turned on, the switching power supply 101 starts a switching operation based on a clock signal with a frequency that is preset in a first clock generation circuit 104 of the switching power supply 101, and supplies a power supply voltage to the switching amplifier 102. When the power supply voltage from the switching power supply 101 is supplied to the switching amplifier 102, a second clock generation circuit 105 of the switching amplifier 102 starts to operate. The switching amplifier 102 performs a switching operation by a clock signal generated by the second clock generation circuit 105. The clock signal generated by the second clock generation circuit 105 is frequency-divided by the frequency division circuit 103 and a resultant clock signal is supplied to the first clock generation circuit 104 of the switching power supply 101. The first clock generation circuit 104 generates a clock signal having a frequency based on (i.e., synchronized with) the frequency of the clock signal from the frequency division circuit 103 and the switching power supply 101 performs a switching operation by the clock signal. Therefore, when power is tuned on, too, the second clock generation circuit 105 can be caused to start to operate by a power supply voltage from the switching power supply 101 and thus there is no need to separately provide another power supply circuit for causing the second clock generation circuit 105 to operate when power is turned on.

(Switching Power Supply)

The switching power supply 101 performs a switching operation on switching elements for switching an input power supply voltage (direct-current voltage) E, by a clock signal with a frequency set in the first clock generation circuit 104, for immediately after power is turned on; and performs a switching operation on the switching elements by a clock signal generated to be synchronized with a clock signal supplied from the frequency division circuit 103, for after the switching amplifier 102 has started to operate.

As shown in FIG. 2, the switching power supply 101 includes a switching circuit 11, a transformer T, a rectifier circuit 12, a smoothing circuit 13, and the first clock generation circuit 104.

The switching circuit 11 switches an input voltage E which is a direct-current voltage and converts the input voltage E into an alternating voltage having a predetermined frequency. The switching circuit 11 includes first and second switching elements SW1 and SW2 composed of, for example, MOSFETs. The first switching element SW1 is on/off operated by a clock signal CLK1 supplied from the first clock generation circuit 104 and the second switching element SW2 is on/off operated by a clock signal CLK2.

The transformer T increases a voltage value inputted to a primary winding to a predetermined voltage value and outputs the predetermined voltage value from a secondary winding. The rectifier circuit 12 rectifies an output from the secondary winding of the transformer T and includes, for example, a diode bridge circuit. The smoothing circuit 13 includes capacitors C1 and C2 and smoothes an output from the rectifier circuit 12. An output from the smoothing circuit 13 is supplied, as a power supply voltage, to the switching amplifier 102 from an output terminal.

The first clock generation circuit 104 generates clock signals CLK1 and CLK2 for causing the first and second switching elements SW1 and SW2 to be on/off operated. The first clock generation circuit 104 includes a clock generating unit 14 and terminals 104a to 104e. To the terminals 104a and 104b are connected a resistor R1 and a capacitor C3, respectively. By the resistor R1 and the capacitor C3, the frequency (e.g., about 180 kHz) of a clock signal CLK0 generated by the clock generating unit 14 when power is turned on is set. The terminal 104c is connected to an output terminal of the frequency division circuit 103. After the second clock generation circuit 105 has started to operate, a clock signal CLK4 is supplied from the frequency division circuit 103 to the clock generating unit 14.

When power is turned on and in a state in which a clock signal CLK4 is not supplied from the frequency division circuit 103 to the terminal 104c, the clock generating unit 14 generates a clock signal CLK0 with a predetermined frequency (about 180 kHz) which is determined by the resistor R1 and the capacitor C3. The first clock generation circuit 104 generates clock signals CLK1 and CLK2 whose frequencies are half (i.e., the frequencies are about 90 kHz) that of the clock signal CLK0 generated by the clock generating unit 14, and supplies the clock signals CLK1 and CLK2 to the first and second switching elements SW1 and SW2, respectively, through the terminals 104d and 104e.

On the other hand, after the switching amplifier 102 has started to operate and in a state in which a clock signal CLK4 is supplied from the frequency division circuit 103 to the terminal 104c, the clock generating unit 14 generates a clock signal CLK0 having the same frequency (about 200 kHz) as the clock signal CLK4. That is, the clock generating unit 14 generates a clock signal CLK0 that is synchronized with the frequency of the clock signal CLK4. The first clock generation circuit 104 generates clock signals CLK1 and CLK2 whose frequencies are half (i.e., the frequencies are about 100 kHz) that of the clock signal CLK0 generated by the clock generating unit 14, and supplies the clock signals CLK1 and CLK2 to the first and second switching elements SW1 and SW2, respectively, through the terminals 104d and 104e.

(Switching Amplifier)

Figure 3:
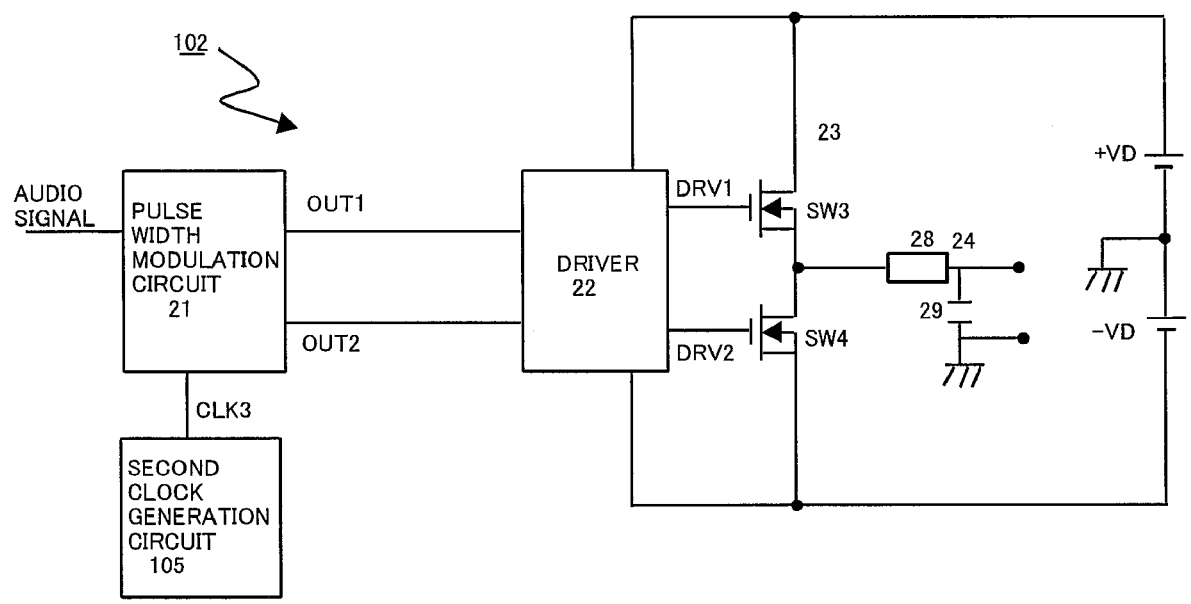
FIG. 3 is a schematic block diagram showing a configuration of a switching amplifier 102.

The switching amplifier 102 modulates the pulse width of an input signal in a pulse modulation circuit (e.g., a pulse width modulation circuit) and thereby generates a pulse width modulated signal, and performs on/off control of switching elements according to the pulse width modulated signal and thereby amplifies the input signal. FIG. 3 is a schematic block diagram showing a configuration of the switching amplifier 102. The switching amplifier 102 includes a pulse width modulation circuit 21, a driver 22, a switching output circuit 23, an LPF (Low-Pass Filter) 24, and the second clock generation circuit 105. Note that in FIG. 2, the driver 22, the switching output circuit 23, and the LPF 24 are not described.

The pulse width modulation circuit 21 modulates the pulse width of an input signal based on a clock signal CLK3 (the frequency is 400 kHz, for example) supplied from the second clock generation circuit 105 and thereby generates a first pulse width modulated signal OUT1 and a second pulse width modulated signal OUT2. When one of the first pulse width modulated signal OUT1 and the second pulse width modulated signal OUT2 is a high-level signal, the other is a low-level signal. The driver 22 accepts as input the first pulse width modulated signal OUT1 and the second pulse width modulated signal OUT2 and outputs drive signals DRV1 and DRV2 for driving switching elements which will be described later.

The switching output circuit 23 is connected between a first power supply (e.g., a positive power supply +VD) and a second power supply (e.g., a negative power supply −VD) which are supplied from the switching power supply 101, and outputs a positive power supply +VD or a negative power supply −VD in response to a drive signal. The switching output circuit 23 includes switching elements (e.g., MOSFETs) SW3 and SW4.

The LPF 24 is connected between an output terminal of the switching output circuit 23 and an output terminal of the switching amplifier 102. The LPF 24 removes a high-frequency component and outputs the resultant to a load such as a speaker. The LPF 24 includes a coil 28 and a capacitor 29.

The second clock generation circuit 105 generates a clock signal CLK3 for driving the pulse width modulation circuit 21. As shown in FIG. 2, the second clock generation circuit 105 includes an oscillation device (e.g., CERALOCK) 30, resistors R2 and R3, capacitors C4 and C5, and inverters 31 to 33. A clock signal outputted from the oscillation device 30 is waveform-shaped by the resistors R2 and R3, the capacitors C4 and C5, and the inverters 31 and 32, whereby a rectangular wave-shaped clock signal CLK3 is generated. The frequency of the clock signal CLK3 is 400 kHz, for example. The clock signal CLK3 is supplied to the pulse width modulation circuit 21. The inverter 33 inverts and buffers the clock signal CLK3 and supplies the clock signal CLK3 to the frequency division circuit 103.

(Frequency Division Circuit)

The frequency division circuit 103 generates a clock signal CLK4 which is obtained by frequency-dividing a clock signal CLK3 supplied from the second clock generation circuit 105 at a predetermined frequency division ratio, and supplies the clock signal CLK4 to the first clock generation circuit 104 of the switching power supply 101. As described above, when the first clock generation circuit 104 outputs clock signals CLK1 and CLK2 whose frequencies are half that of a clock signal CLK0 generated by the clock generating unit 14, in order to obtain clock signals CLK1 and CLK2 (about 100 kHz) which drive the switching power supply 101 by reducing the frequency (about 400 kHz) of a clock signal CLK3 which drives the pulse width modulation circuit 21 to one-quarter, the frequency division ratio of the frequency division circuit 103 is set to 2. That is, the frequency division circuit 103 divides the frequency of the clock signal CLK3 by two and thereby generates a clock signal CLK4 whose frequency is half (about 200 kHz) that of the clock signal CLK3.

As shown in FIG. 2, the frequency division circuit 103 includes a frequency dividing unit (e.g., a flip-flop circuit) 51 that frequency-divides a clock signal CLK3 from the second clock generation circuit 105 by half, an inverter 52, an AND circuit 53, a resistor R4, and a capacitor C6. To one input terminal of the AND circuit 53 is supplied an output from the frequency dividing unit 51, and to an other input terminal is supplied a signal obtained by inverting the output from the frequency dividing unit 103 by the inverter 52 and making the rise and fall of the inverted output gradual by the resistor R4 and the capacitor C6. As a result, a clock signal CLK4 outputted from the AND circuit 53 is a clock signal obtained by dividing the frequency of the clock signal CLK3 by half and shortening a high-level period. Such a clock signal CLK4 is used by the clock generating unit 14 of the first clock generation circuit 104 to generate a clock signal CLK0 having the same frequency as (synchronized with) the clock signal CLK4 generated by the frequency division circuit 103.

(Operation)

The operation of the audio apparatus 1 having the above-described configuration will be described. Note that FIGS. 4A to 4E show waveform simulation results at various points. Immediately after power is turned on, a power supply voltage is not supplied from the switching power supply 101 to the switching amplifier 102 and thus the second clock generation circuit 105 cannot supply a clock signal CLK3 to the pulse width modulation circuit 21 and the frequency division circuit 103. Hence, a clock signal CLK4 is not supplied from the frequency division circuit 103 to the clock generating unit 14 of the first clock generation circuit 104 of the switching power supply 101.

Figure 4A:
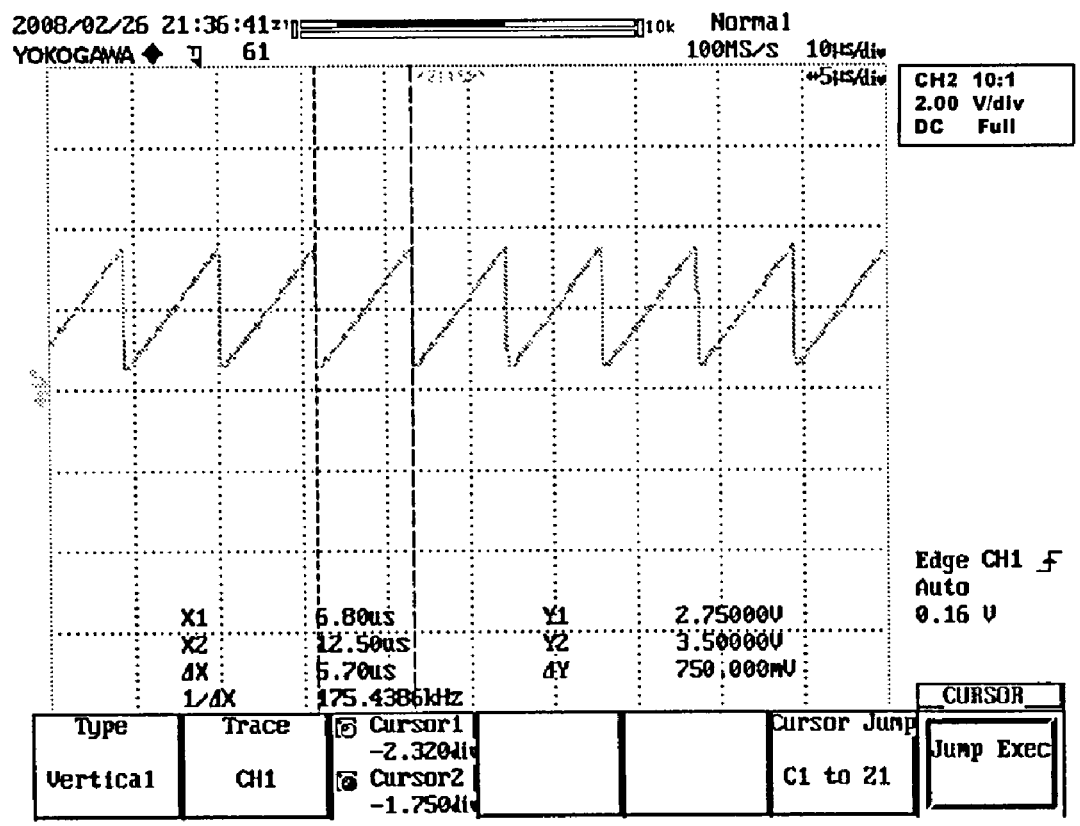
Figure 4B:
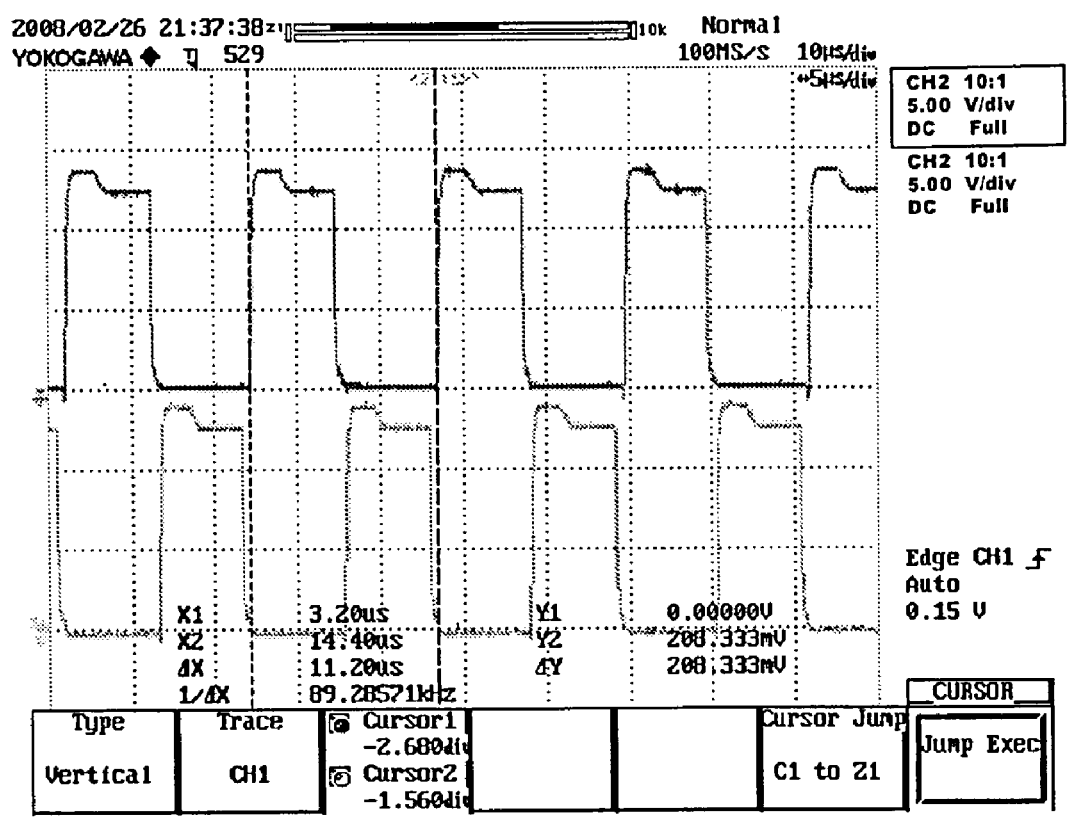
Figure 4C:
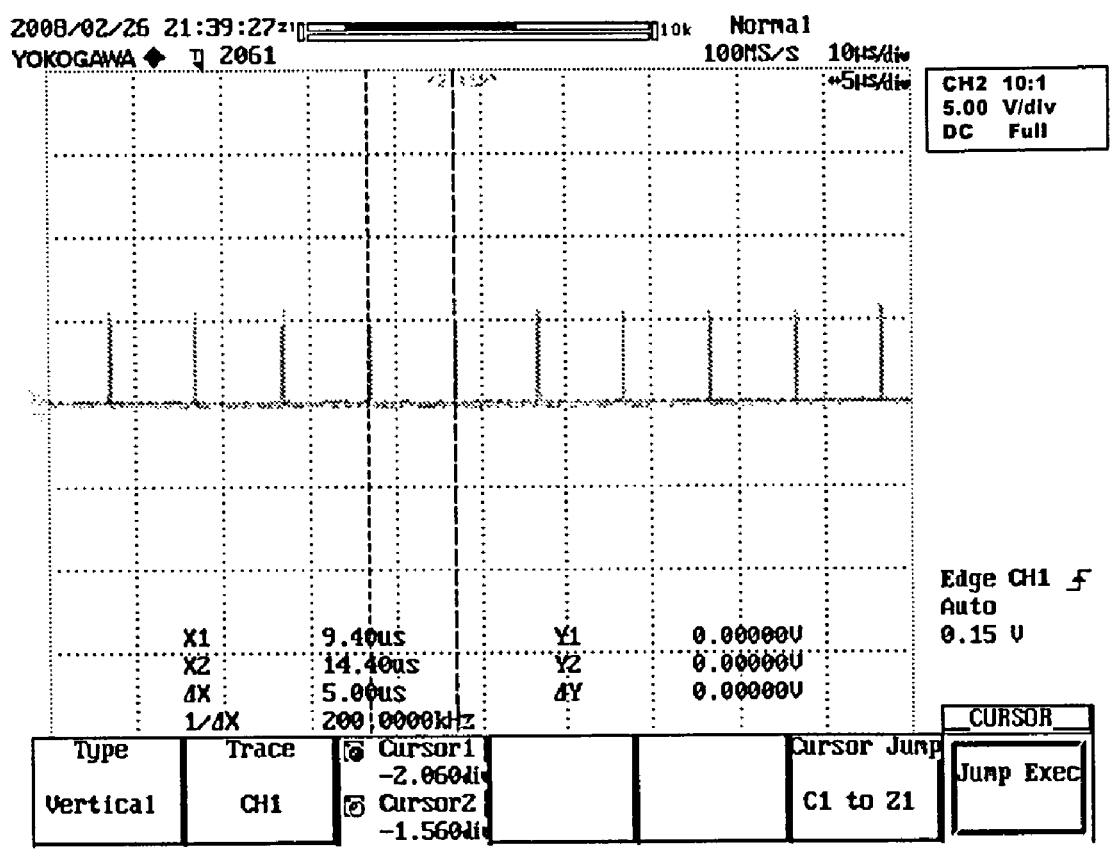
FIG. 4C is a diagram showing a simulation result showing a waveform of a clock signal CLK4.

When a power supply voltage E is supplied to the first clock generation circuit 104, the clock generating unit 14 generates a clock signal CLK0 with a frequency (about 180 kHz) that is preset by the resistor R1 and the capacitor C3 (see FIG. 4A). The first clock generation circuit 104 outputs clock signals CLK1 and CLK2 whose frequencies are half that of the clock signal CLK0, to the switching elements SW1 and SW2 (see FIG. 4B). Accordingly, the switching elements SW1 and SW2 switch the power supply voltage E, whereby the switching power supply circuit 101 supplies a power supply voltage to the switching amplifier 102.

When the power supply voltage is supplied from the switching power supply circuit 101 to the switching amplifier 102, the second clock generation circuit 105 generates a clock signal CLK3 (about 400 kHz). By the clock signal CLK3, the switching amplifier 102 starts to operate. Specifically, the pulse width modulation circuit 21 generates a pulse width modulated signal which is modulated using an input signal based on the clock signal CLK3, and by the pulse width modulated signal the switching elements SW3 and SW4 perform a switching operation.

The clock signal CLK3 from the second clock generation circuit 105 is supplied also to the frequency division circuit 103. The frequency division circuit 103 generates a clock signal CLK4 (the frequency is about 200 kHz) obtained by dividing the frequency of the clock signal CLK3 by half and furthermore shortening a high-level period, and supplies the clock signal CLK4 to the first clock generation circuit 104 (see FIG. 4C).

Figure 4D:
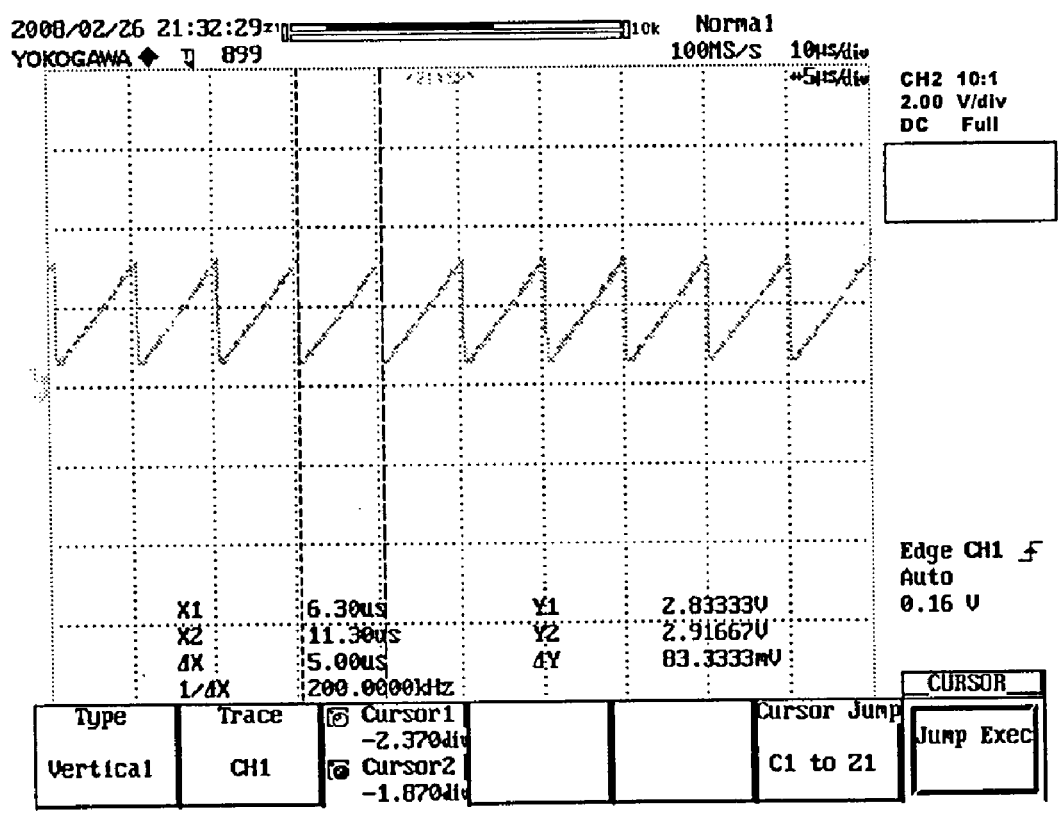
FIG. 4D is a diagram showing a simulation result showing a waveform of a clock signal CLK0 which is synchronized with the clock signal CLK4.
Figure 4E:
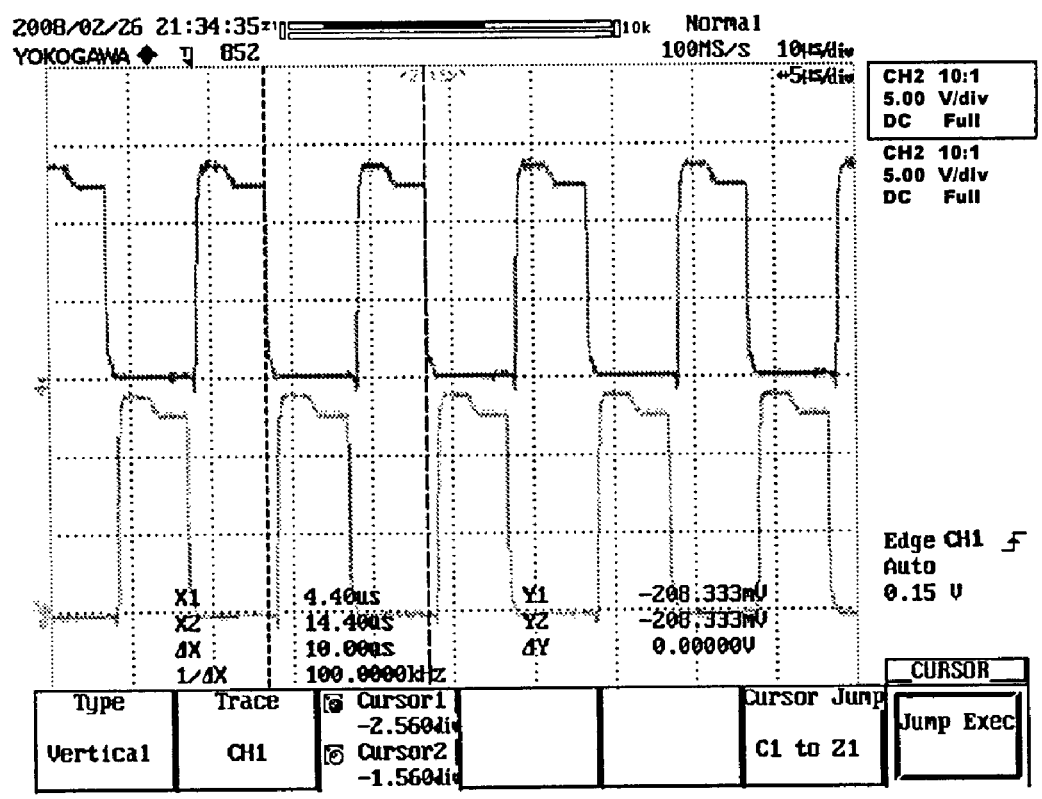
FIG. 4E is a diagram showing simulation results showing waveforms of clock signals CLK1 and CLK2 generated using the clock signal CLK0 which is synchronized with the clock signal CLK4.

When the clock signal CLK4 is supplied to the first clock generation circuit 104, the clock generating unit 14 generates a clock signal CLK0 having the same frequency (about 200 kHz) as the clock signal CLK4 (see FIG. 4D). More specifically, the clock generating unit 14 generates a clock signal that rises to a high level in response to a rise of the clock signal CLK4 to a high level and thereby generates a clock signal CLK0 having the same frequency as the clock signal CLK4. The first clock generation circuit 104 outputs clock signals CLK1 and CLK2 whose frequencies are half (about 100 kHz) that of the clock signal CLK0, to the switching elements SW1 and SW2 (see FIG. 4E). Accordingly, the switching power supply 101 is driven by the clock signals CLK1 and CLK2 with a frequency that is obtained by frequency-dividing the clock signal CLK3 which drives the pulse width modulation circuit 21 of the switching amplifier 102 to one-quarter (frequency division by four). As a result, occurrence of a beat can be prevented by the clock signal CLK3 and the clock signals CLK1 and CLK2.

As described above, when power is turned on and the second clock generation circuit 105 of the switching amplifier 102 cannot generate a clock signal CLK3, the first clock generation circuit 104 generates clock signals CLK1 and CLK2 with a preset frequency to cause the switching elements SW1 and SW2 to perform a switching operation. Thus, there is no need to separately provide a power supply circuit for causing the second clock generation circuit 105 to operate when power is turned on. After the second clock generation circuit 105 has started to operate, the first clock generation circuit 104 generates clock signals CLK1 and CLK2 with a frequency obtained by dividing the frequency of a clock signal CLK3 which drives the pulse width modulation circuit 21, to cause the switching elements SW1 and SW2 to perform a switching operation. Accordingly, since in a steady state the clock signal CLK3 and the clock signals CLK1 and CLK2 have an integral multiple relationship (are synchronized with each other), occurrence of a beat can be prevented.

Although the preferred embodiment of the present invention is described above, the present invention is not limited thereto. For example, the frequencies of clock signals CLK0 to CLK4 are not limited to those described above. Also, a pulse density modulation circuit may be used instead of a pulse width modulation circuit.

What is claimed is:

1. An audio apparatus comprising a switching power supply, a switching amplifier, and frequency dividing section, wherein
the switching power supply includes:
first switching section for outputting a power supply voltage to the switching amplifier by performing a switching operation; and
first clock generating section for generating a first clock signal that causes the first switching section to perform a switching operation,
the switching amplifier includes:
pulse modulating section for generating a pulse modulated signal according to an input signal;
second switching section that performs a switching operation by the pulse modulated signal; and
second clock generating section caused to operate by the power supply voltage supplied from the switching power supply, to generate a second clock signal that drives the pulse modulating section,
the frequency dividing section divides a frequency of the second clock signal supplied from the second clock generating section, to generate a third clock signal,
in a state in which the third clock signal is not supplied from the frequency dividing section to the first clock generating section because a power supply voltage is not supplied from the switching power supply to the second clock generating section, the first clock generating section generates the first clock signal with a frequency that is preset in the first clock generating section, and
in a state in which a power supply voltage is supplied from the switching power supply to the second clock generating section and thus the third clock signal is supplied from the frequency dividing section to the first clock generating section, the first clock generating section generates the first clock signal with a frequency that is synchronized with a frequency of the third clock signal.

2. A switching power supply applied to the audio apparatus according to claim 1, the switching power supply comprising:
first switching section for outputting a power supply voltage to the switching amplifier by performing a switching operation; and
first clock generating section for generating a first clock signal that causes the first switching section to perform a switching operation, wherein
in a state in which the third clock signal is not supplied from the frequency dividing section to the first clock generating section because a power supply voltage is not supplied from the switching power supply to the second clock generating section, the first clock generating section generates the first clock signal with a frequency that is preset in the first clock generating section, and
in a state in which a power supply voltage is supplied from the switching power supply to the second clock generating section and thus the third clock signal is supplied from the frequency dividing section to the first clock generating section, the first clock generating section generates the first clock signal with a frequency that is synchronized with a frequency of the third clock signal.

3. A switching control method for an audio apparatus including a switching power supply and a switching amplifier, the method comprising the steps of:
when power to the audio apparatus is turned on and in a state in which a power supply voltage from the switching power supply is not supplied to the switching amplifier, generating, by the switching power supply, a first clock signal with a frequency that is preset in the switching power supply;
causing the switching power supply to operate by the first clock signal with a frequency that is preset in the switching power supply, to supply a power supply voltage to the switching amplifier;
generating, by the switching amplifier, a second clock signal by the power supply voltage supplied from the switching power supply;
causing the switching amplifier to operate by the second clock signal;
generating a third clock signal by dividing a frequency of the second clock signal, and supplying the third clock signal to the switching power supply;
in a state in which the third clock signal is supplied to the switching power supply, generating, by the switching power supply, the first clock signal with a frequency that is synchronized with a frequency of the third clock signal; and
causing the switching power supply to operate by the first clock signal with the frequency based on the frequency of the third clock signal, to supply a power supply voltage to the switching amplifier.

* * * * *